United States Patent [19]

Chari et al.

[11] Patent Number: 5,307,039
[45] Date of Patent: Apr. 26, 1994

[54] FRUSTOCONICAL MAGNET FOR MAGNETIC RESONANCE IMAGING

[75] Inventors: Madabushi V. Chari, Burnt Hills; Evangelos T. Laskaris, Schenectady; Michele D. Ogle, Burnt Hills, all of N.Y.

[73] Assignee: General Electric Company, Schenectady, N.Y.

[21] Appl. No.: 942,003

[22] Filed: Sep. 8, 1992

[51] Int. Cl.$^5$ ............................................. H01F 5/00
[52] U.S. Cl. .................................. 355/299; 324/318; 128/653.5
[58] Field of Search ................ 324/318, 319; 335/216, 335/299, 300; 128/653.1, 653.2, 653.3, 653.4, 653.5

[56] References Cited

U.S. PATENT DOCUMENTS

| | | | |
|---|---|---|---|
| 4,841,249 | 6/1989 | Duerr et al. | 324/318 |
| 4,875,485 | 10/1989 | Matsutani . | |
| 4,876,510 | 10/1989 | Siebold et al. | 335/216 |
| 4,924,198 | 5/1990 | Laskaris . | |
| 5,008,624 | 4/1991 | Yoshida . | |
| 5,085,219 | 4/1992 | Ortendahl et al. | 128/635.5 |
| 5,117,188 | 5/1992 | Ohkawa | 324/318 |
| 5,153,546 | 10/1992 | Laskaris | 335/298 |
| 5,185,576 | 2/1993 | Vaverk et al. | 128/653.5 |

Primary Examiner—Lincoln Donovan
Attorney, Agent, or Firm—Patrick R. Scanlon; Paul R. Webb, II

[57] ABSTRACT

An open magnet having a frustoconical shaped inner bore is provided for MR imaging. The magnet has a plurality of axisymmetric superconducting coils of differing diameters which are disposed along an axis in order of successively increasing diameters so as to define the frustoconical shape. This shape permits a patient access opening which is much larger than that in conventional cylindrical magnets. The overall length is much less than the length of conventional systems. The combination of wide opening and short length facilitates patient access and presents a feeling of openness. Furthermore, the device can be tilted with respect to horizontal to increase the openness.

19 Claims, 4 Drawing Sheets

FRUSTOCONICAL MAGNET FOR MAGNETIC RESONANCE IMAGING

BACKGROUND OF THE INVENTION

This invention relates generally to magnetic resonance imaging magnets and more particularly concerns an open, frustoconical-shaped magnet arrangement which uses a plurality of refrigerated superconducting coils.

Magnetic resonance imaging (MRI) is now a widely accepted medical diagnostic procedure and its use is becoming increasingly popular. MRI systems require a uniform magnetic field and radio frequency radiation to create an MR image. Various types of magnets are currently used to produce the magnetic field. Whatever type of magnet is used, it is necessary that a portion of the magnetic field be highly homogeneous. This portion of the magnetic field, referred to herein as the imaging volume, is the portion of the field which covers the subject area being imaged. Field homogeneity in the imaging volume is necessary to obtain a quality image. Therefore, it is advantageous for many imaging applications to have a magnet which can produce a relatively large imaging volume.

Currently, the magnets most commonly used for whole body imaging are arranged so as to be contained within a long cylindrical structure having a relatively narrow central bore. The narrow bore forms an enclosed chamber into which a patient must enter for imaging. Typically, these structures are approximately 2.4 meters in length with a bore diameter of about one meter. These cylindrical arrangements provide many positive features, but there are some circumstances in which they present difficulties. For example, a significant percentage of patients are sensitive to the closed nature of conventional MRI systems. For them, the MRI process can be uncomfortable or even unbearable. Furthermore, some patients are simply too large to fit into the narrow bore of a conventional MRI system. Difficulties can also arise in placing a patient in the enclosed chamber if the patient is required to remain connected to an IV system or other medical equipment. The closed conventional systems are also difficult for veterinary applications because many animals are frightened by the closed chamber.

Various open MRI magnets have been proposed as more accessible alternatives to the closed conventional systems. For instance, U.S. Pat. No. 4,875,485, issued Oct. 24, 1989 to Kinya Matsutani and U.S. Pat. No. 4,924,198 to Evangelos T. Laskaris both show magnet assemblies having two superconducting coils arranged in a spaced-apart, parallel relationship. The open space between the two coils is well-suited to receiving patients and is not likely to induce claustrophobic reactions. While these arrangements are effective, the homogeneity could be better. Thus, it would be advantageous to have an MRI device which provides a more open feeling than conventional systems and produces a large imaging volume having an exceptional level of homogeneity.

SUMMARY OF THE INVENTION

Accordingly, it is an object of the present invention to provide easy access for whole body MR imaging to all patients including those who are sensitive to closed spaces.

More specifically, it is an object of the present invention to provide an open, frustoconical magnet arrangement for MR imaging which maintains a highly homogeneous field in a large imaging volume.

In addition, it is an object of the present invention to facilitate MR imaging for veterinary applications.

These and other objects are accomplished in the present invention by providing an open magnet having a plurality of axisymmetric superconducting coils of differing diameters which are disposed along an axis such that they resemble a truncated cone. That is, the coils are arranged in order of successively increasing diameters. This frustoconical shape permits a patient access opening which is significantly larger than that in conventional cylindrical magnets. In addition, the overall length is much less than the length of conventional systems. This combination of wide opening and short length facilitates patient access and presents a feeling of openness. Furthermore, the device can be tilted with respect to horizontal to increase the openness.

Other objects and advantages of the present invention will become apparent upon reading the following detailed description and the appended claims and upon reference to the accompanying drawings.

DESCRIPTION OF THE DRAWINGS

The subject matter which is regarded as the invention is particularly pointed out and distinctly claimed in the concluding portion of the specification. The invention, however, may be best understood by reference to the following description taken in conjunction with the accompanying drawing figures in which:

DETAILED DESCRIPTION OF THE INVENTION

Figure 1:
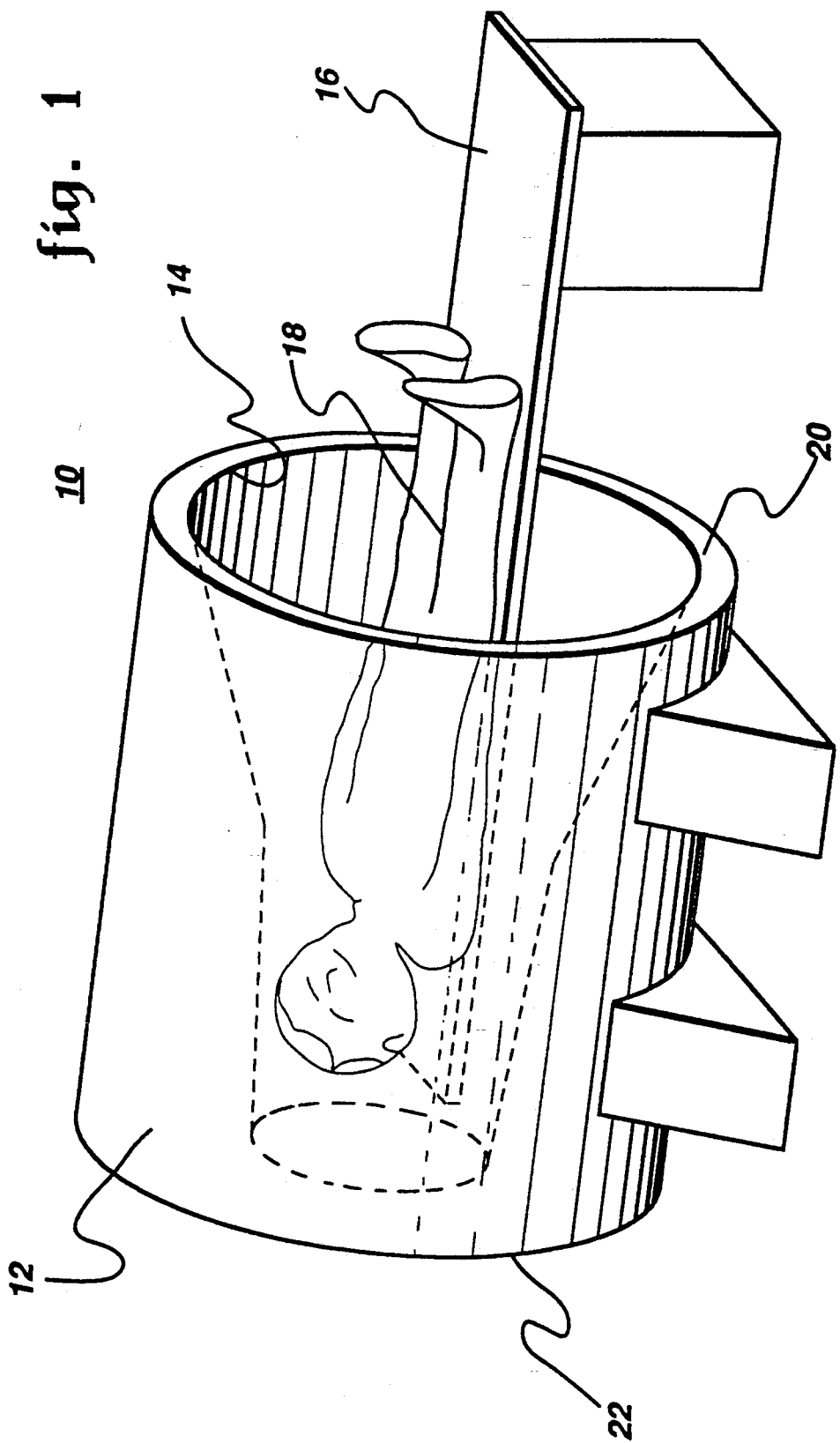
FIG. 1 is an isometric view of the MRI magnet of the present invention.

Referring now to the drawing where like numerals indicate like elements throughout, FIG. 1 shows an MRI magnet 10 of the present invention. The magnet 10 comprises a shell or casing 12 having a substantially cylindrical outer surface. The casing contains magnetic means such as a superconducting magnet, a normally-conducting magnet, or a permanent magnet. As described below, a superconducting magnet is preferred. A bore 14 is formed along the longitudinal axis of the magnet 10 and extends from the front face 20 of the magnet 10 to the rear face 22. The bore is such that it forms a relatively large opening in the front face 20 and a smaller opening in the rear face 22. The inner surface of the bore 14 accordingly tapers from the large opening to the small opening, thus defining a substantially frustoconical shape (i.e., the shape of a truncated cone). A horizontal bed 16 is disposed in the bore 14 to support a patient 18 therein for imaging. As is known in the MR imaging field, RF and gradient coils (not shown) are included to obtain the MR image.

The opening in the front face 20 of the magnet 10 has a diameter which is significantly larger than the inner diameter of typical cylindrical MRI magnets. Furthermore, the overall length of the magnet 10 is significantly less than the length of the conventional cylindrical magnets. The combination of the larger opening and shorter length provides a more open feeling to a patient, thereby alleviating much of the anxieties associated with the imaging process. This arrangement also provides much greater access as the tapered bore 14 is sufficiently large to easily accommodate the head or legs of a patient.

Figure 2:
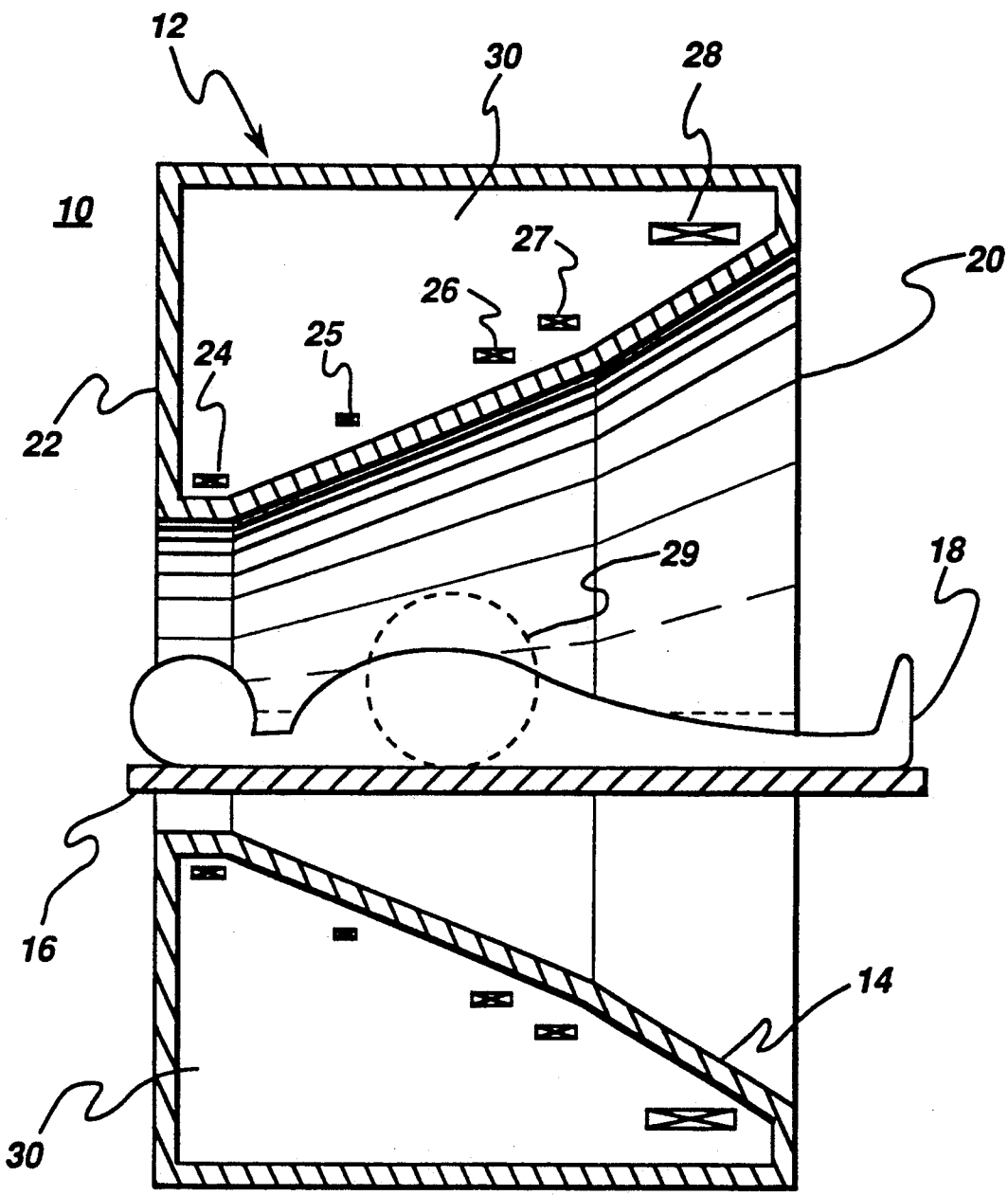
FIG. 2 is a cross-sectional side view of a first embodiment of the present invention.

FIG. 2 shows the magnet 10 in more detail. The magnet 10 preferably comprises five superconducting coils 24–28 spaced axisymmetrically along the longitudinal axis of the bore 14 such that the imaging volume 29 lies inside the coils. The present invention is not limited to specifically five coils; any suitable combination which would produce sufficient field strength and homogeneity could be used. As seen in the Figure, the five coils 24–28 are spaced along the longitudinal axis of the bore 14 in order of progressively increasing diameter. That is, the first coil 24, which is the left most in the Figure, has the smallest diameter and each successive coil has a larger diameter up to the right most coil 28 which has the largest diameter.

The coils are preferably constructed of niobium tin (Nb3Sn) superconductor material, which is wound in uniform layers and then epoxy impregnated. Alternatively, the coils 24–28 may be made from niobium titanium (NbTi) superconductor and operated in helium. The magnet is enclosed in a vacuum tight vessel 30 having a cylindrical outer surface. The inner surface of the vacuum vessel 30 follows the general outline defined by the superconducting coils, thereby forming the substantially frustoconical shape of the bore 14. The coils 24–28 are held in position by a support structure (not shown) which is constructed in such a way as to prevent motion of the coils due to electromagnetic forces. The structure must also maintain the coils in their proper position when cooled to operational temperature. The structure is preferably made from a heat conductive material such as stainless steel to maintain uniform temperature through the coils.

The magnet is cooled to about 10° K by a two-stage cryocooler such as one operating on the Gifford-McMahon cycle. The first stage of the cryocooler is heat stationed to a thermal shield (not shown), preferably made of aluminum, which surrounds the coils. The second stage of the cryocooler is heat stationed to the support structure. The specific constitution of the coils, the support structure, and the thermal shield are generally known in the art and by themselves do not constitute an inventive aspect of the present invention. Thus, they need not be described in further detail.

In a preferred configuration of the embodiment of FIG. 2, the opening in the front face 20 of the magnet 10 has a diameter of 1.86 meters and the opening in the rear face 22 has a diameter of 0.74 meters The overall length of the magnet 10 is 1.4 meters. The coils 24,25,26 and 28 all carry current in the same circumferential direction while the fourth coil 27 carries current in the opposite circumferential direction. With a central field strength of 0.5 Tesla, this configuration has a calculated homogeneity of 41 ppm on a 40 cm imaging volume and 7 ppm on a 30 cm imaging volume.

Figure 3:
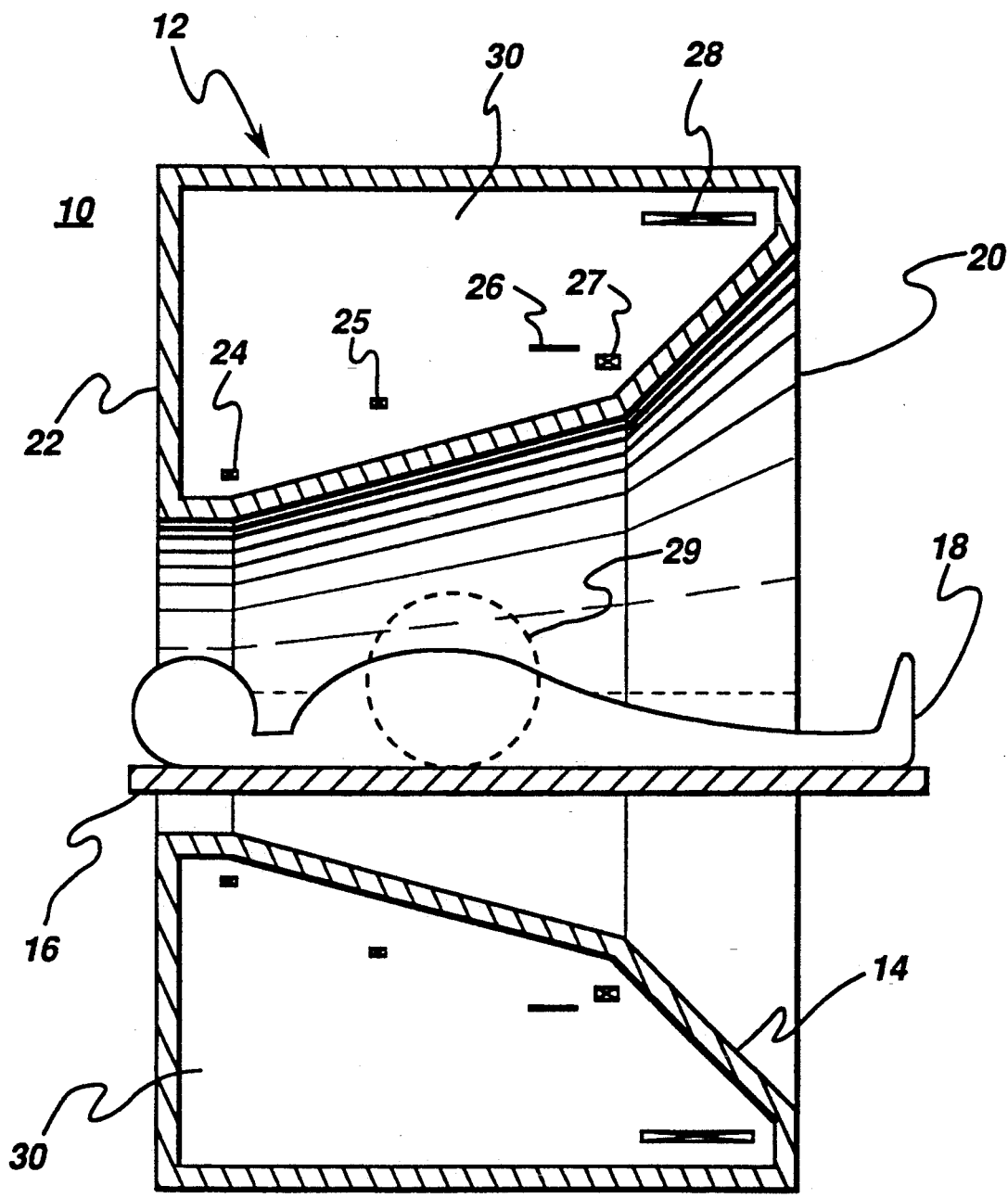
FIG. 3 is a cross-sectional side view of a second embodiment of the present invention.

FIG. 3 shows a second embodiment of the present invention. In this embodiment, the coils 24–28 still define a substantially frustoconical inner bore 14 but they are not positioned fully in order of progressively increasing diameter as with the FIG. 2 embodiment. As seen in FIG. 3, the fourth coil 27 is slightly smaller in diameter than the third coil 26, although the fifth coil 28 is larger than all the others. This arrangement still permits an oversized patient access opening in the front face 20 and a frustoconical inner surface on the bore 14, thereby providing the desired open appearance to the magnet 10. A preferred configuration of this embodiment which provides an exceptionally good, homogeneous imaging volume 29 has large and small diameter openings of 0.80 and 1.85 meters, respectively, and an overall length of 1.4 meters. The coils 24,25,26 and 28 all carry current in the same circumferential direction while the fourth coil 27 carries current in the opposite circumferential direction. With a field strength of 0.5 Tesla, this configuration has a calculated homogeneity of 26.8 ppm on a 40 cm imaging volume and 5.2 ppm on a 30 cm imaging volume.

Figure 4:
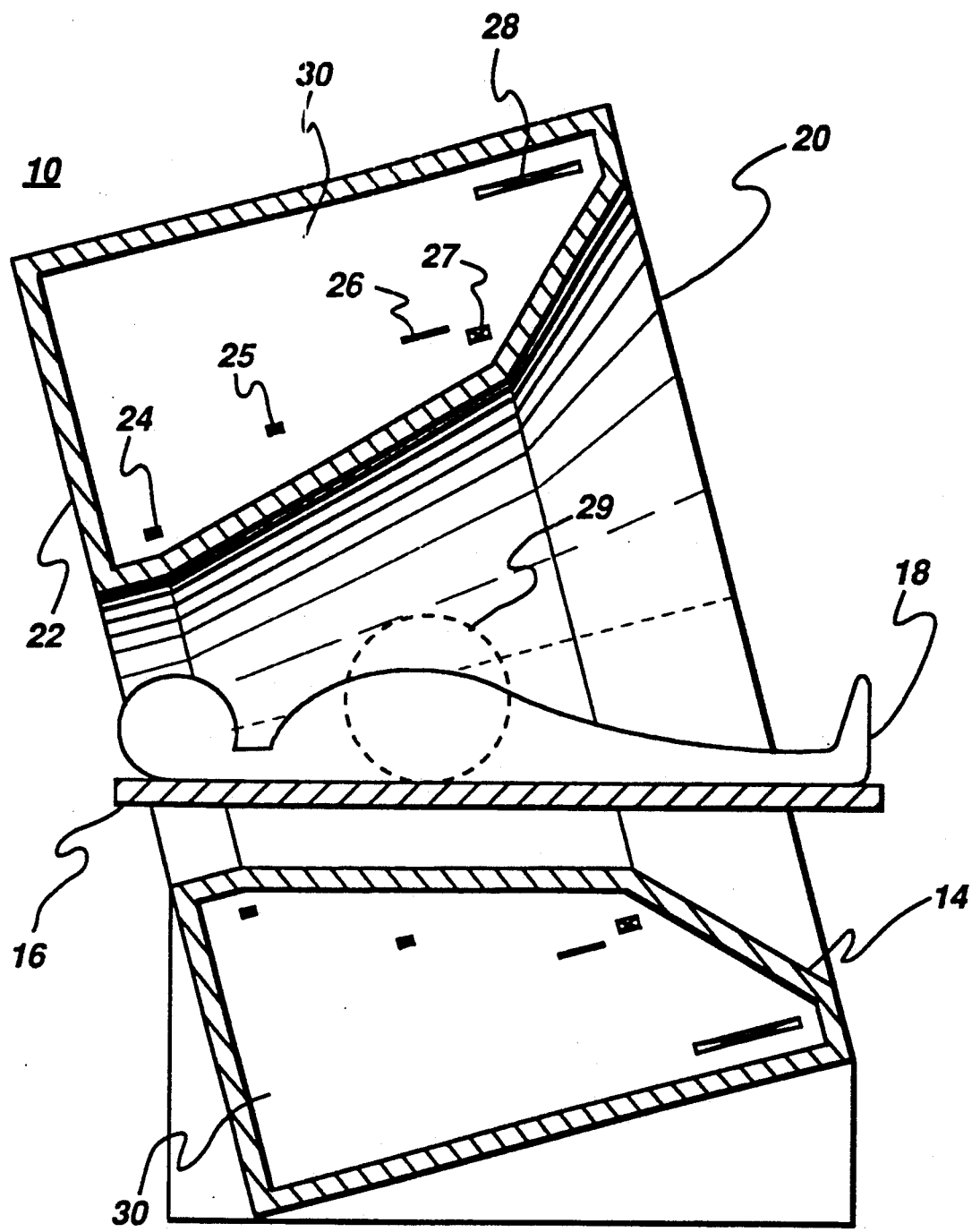
FIG. 4 is a tilted variation of the embodiment of FIG. 3.

FIG. 4 shows a slight variation to the FIG. 3 embodiment wherein the base of the magnet 10 is tilted with respect to horizontal in a manner such that the angle of incline between the upper surface of the bore 14 and the patient-supporting bed 16 is increased. This arrangement provides an even greater feeling of openness to a patient lying on the bed 16, thereby further alleviating any feelings of anxiety which may arise during an imaging procedure. As can be seen in the Figure, the bed 16 is positioned so as to remain adjacent to the imaging volume 29 and permit imaging of a patient. However, the RF and gradient coils will have to be adjusted to compensate for the fact that the magnetic field direction is no longer parallel to the bed 16.

The foregoing has described a frustoconically shaped magnet for MR imaging which is readily accessible and provides a feeling of openness while producing a large, homogeneous imaging volume. While specific embodiments of the present invention have been described, it will be apparent to those skilled in the art that various modifications thereto can be made without departing from the spirit and scope of the invention as defined in the appended claims.

What is claimed is:

1. A magnet assembly, for whole body magnetic resonance imaging, comprising a plurality of axisymmetric superconducting coils of differing diameters, said coils being disposed along an axis in order or successively increasing diameters.

2. The magnet assembly of claim 1 wherein the overall length of said magnet assembly is approximately 1.4 meters.

3. The magnet assembly of claim 1 wherein said plurality of coils comprises five coils.

4. The magnet assembly of claim 1 wherein the current in one of said plurality of coils flows in an direction opposite than the current in the rest of said plurality of coils.

5. The magnet assembly of claim 1 wherein said axis is tilted with respect to horizontal.

6. A magnet assembly, for whole body magnetic resonance imaging, comprising a plurality of axisymmetric superconducting coils of differing diameters, said coils being arranged to define a substantially frustoconical shape.

7. The magnet assembly of claim 6 wherein the overall length of said magnet assembly is approximately 1.4 meters.

8. The magnet assembly of claim 6 wherein said plurality of coils comprises five coils.

9. The magnet assembly of claim 6 wherein the current in one of said plurality of coils flows in an direction opposite than the current in the rest of said plurality of coils.

10. The magnet assembly of claim 6 wherein said coils are disposed along an axis, said axis being tilted with respect to horizontal.

11. A magnetic resonance imaging device, for whole body magnetic resonance imaging, comprising:
a casing having an inner bore for receiving a patient, said bore having a substantially frustoconical shape; and a magnet assembly disposed in said casing.

12. The magnetic resonance imaging device of claim 11 further comprising a horizontal patient-supporting bed disposed in said bore.

13. The magnetic resonance imaging device of claim 12 wherein the longitudinal axis of said bore is tilted with respect to said bed.

14. The magnetic resonance imaging device of claim 11 wherein the widest diameter of said bore is approximately 1.86 meters.

15. The magnetic resonance imaging device of claim 11 wherein the overall length of said device is approximately 1.4 meters.

16. The magnetic resonance imaging device of claim 11 wherein said magnet assembly comprises a plurality of superconducting coils of differing diameters.

17. The magnetic resonance imaging device of claim 16 wherein said plurality of coils comprises five coils.

18. The magnet of claim 16 wherein the current in one of said plurality of coils flows in the opposite direction than the current in the rest of said plurality of coils.

19. The magnetic resonance imaging device of claim 16 wherein said plurality of coils is disposed in order of successively increasing diameters.

* * * * *